(12) United States Patent
Tsumura

(10) Patent No.: US 9,099,443 B2
(45) Date of Patent: Aug. 4, 2015

(54) SEMICONDUCTOR DEVICE AND MANUFACTURING METHOD THEREOF

(71) Applicant: KABUSHIKI KAISHA TOSHIBA, Tokyo (JP)

(72) Inventor: Kazumichi Tsumura, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 62 days.

(21) Appl. No.: 13/975,566

(22) Filed: Aug. 26, 2013

(65) Prior Publication Data

US 2014/0232011 A1    Aug. 21, 2014

(30) Foreign Application Priority Data

Feb. 21, 2013   (JP) .................................. 2013-032339

(51) Int. Cl.
*H01L 23/48* (2006.01)
*H01L 21/768* (2006.01)

(52) U.S. Cl.
CPC ............ *H01L 23/481* (2013.01); *H01L 21/768* (2013.01); *H01L 2924/0002* (2013.01)

(58) Field of Classification Search
CPC ..... H01L 23/48; H01L 23/482; H01L 23/532; H01L 23/522; H01L 23/142; H01L 29/92; H01L 29/94; H01L 29/768

USPC .................. 257/774, 753, 759, 775, 763, 773
See application file for complete search history.

(56) References Cited

U.S. PATENT DOCUMENTS

2011/0215443 A1   9/2011  Hayasaka et al.

FOREIGN PATENT DOCUMENTS

JP        H10-223833 A     8/1998

*Primary Examiner* — Chuong A Luu
(74) *Attorney, Agent, or Firm* — Patterson & Sheridan, LLP

(57) ABSTRACT

A semiconductor device according to an embodiment includes a semiconductor substrate that includes a first region and a second region having a thickness that is less than a thickness of the first region, a first metal film having a same film thickness provided in each of a first through hole, and a second through hole, the first through hole penetrating the semiconductor substrate from the second surface to the first surface in the first region, and the second through hole penetrating the semiconductor substrate from the second surface to the first surface in the second region. A second metal film is formed on the first metal films and is provided inside the first through hole, and inside and outside of the second through hole. A thickness of the second metal film located outside the second through hole is greater than a thickness of the second metal film located outside the first through hole, and heights of upper surfaces of the second metal film in the first and second regions are the same.

13 Claims, 8 Drawing Sheets

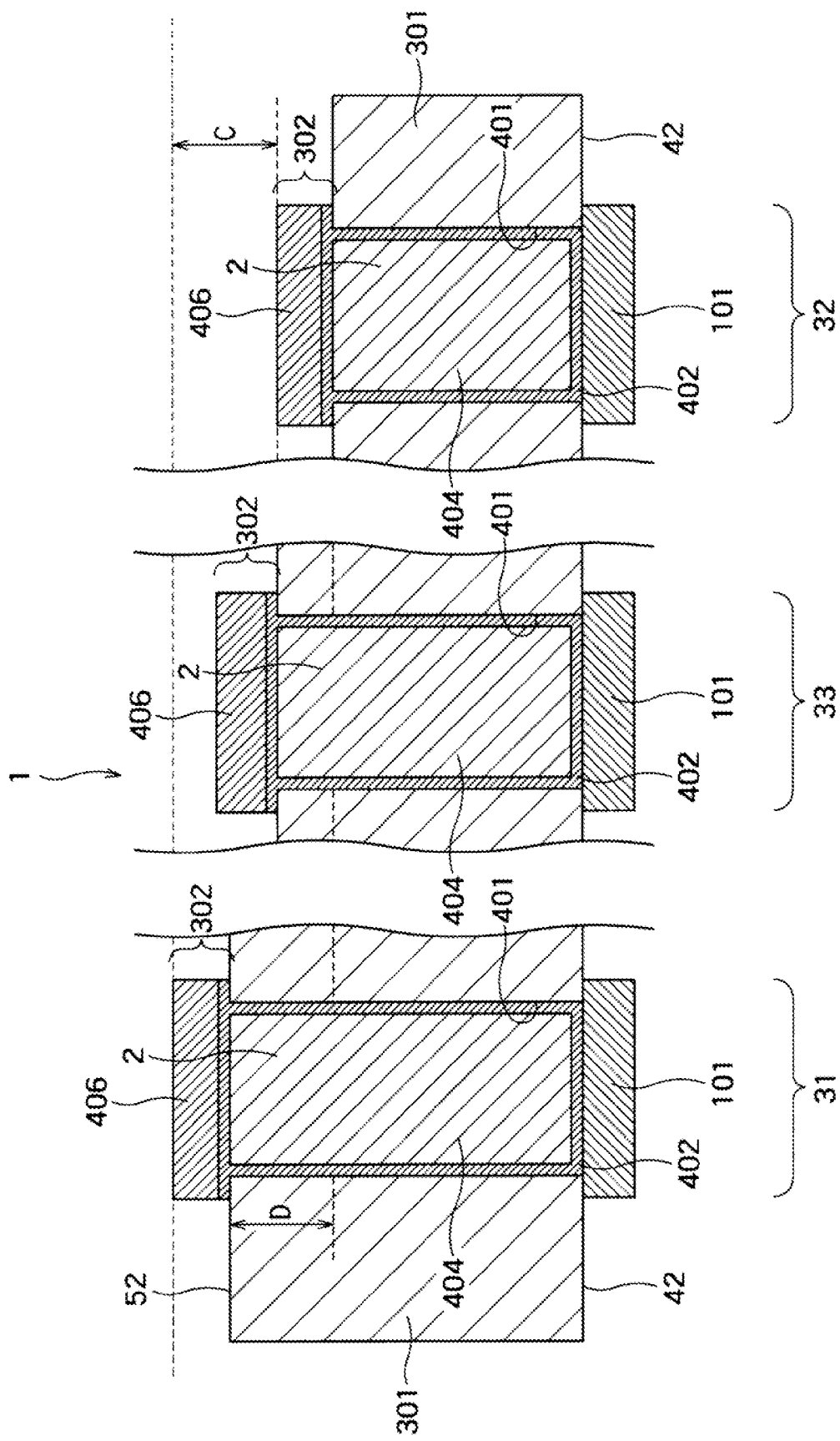

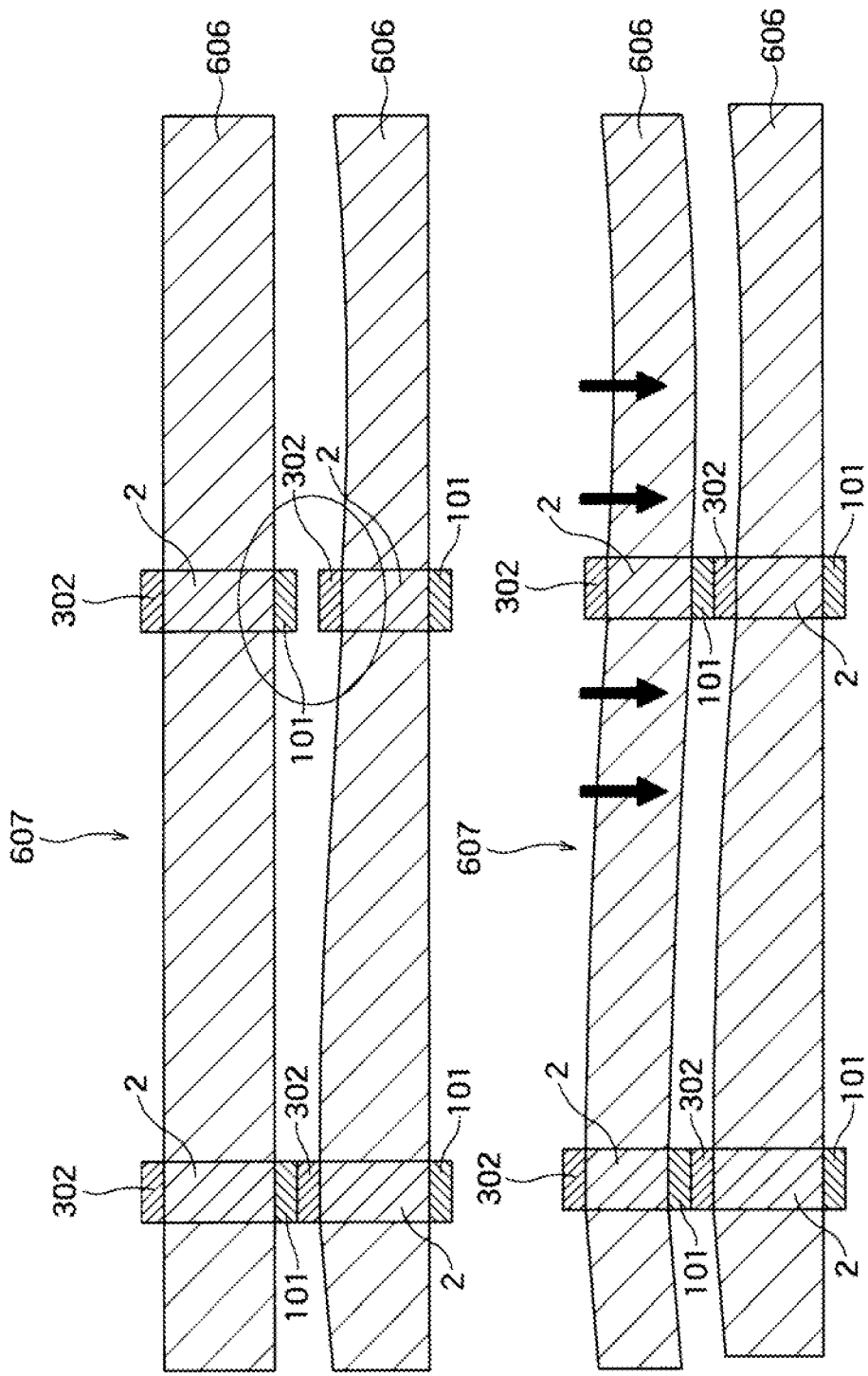

SEMICONDUCTOR DEVICE AND MANUFACTURING METHOD THEREOF

CROSS-REFERENCE TO RELATED APPLICATION

This application is based upon and claims the benefit of priority from Japanese Patent Application No. 2013-032339, filed Feb. 21, 2013, the entire contents of which are incorporated herein by reference.

FIELD

Embodiments of the present invention relates to a semiconductor device and a manufacturing method thereof.

BACKGROUND

Recently, through silicon via (TSV) is used in a semiconductor device as an electrode that penetrates perpendicularly through a semiconductor substrate on which various electronic elements are provided. By electrically connecting a plurality of semiconductor chips using this TSV, the plurality of semiconductor chips are mounted with high density, and high speed data communication, and the like, is enabled.

The TSV is formed by a via last/backside via TSV process, for example. In detail, after forming active elements on a semiconductor substrate, such as memories, wiring layers that connect those elements, and surface side electrodes for connecting to the TSV formed on subsequent processes, the semiconductor substrate is adhered onto a support substrate, such as glass, using adhesive or the like. The semiconductor substrate is attached to the support substrate so that the surface of the semiconductor substrate, on which the active elements, the wire layers and the surface side electrodes are present, faces the support substrate. Thereafter, by grinding the back surface of the semiconductor substrate, a film thickness of several hundreds of μm is thinned down to several tens of μm, for example. Next, the TSV is formed using a method, such as lithography, dry etching, plating, chemical mechanical planarization (CMP), and the like, and a TSV hole that penetrates the semiconductor substrate from the back surface side of the semiconductor substrate is formed. For the TSV hole, a barrier metal is formed by spattering, and then, a metal film, such as a copper film, is embedded by plating. Moreover, by removing an excess metal film using CMP, the TSV is formed. Then, a back side electrode is formed on a bump by using a method, such as sputtering, lithography, plating, wet etching, and the like.

By forming a plurality of semiconductor chips by separating (dividing) such a semiconductor substrate, and by stacking the semiconductor chips, a stacked module is formed. In the stacked module, devices included in each of the stacked semiconductor chips are electrically connected to each other by using the TSV and bumps.

SUMMARY

The present invention is to provide a semiconductor device that can improve device reliability and device characteristics while avoiding connection failure between a plurality of semiconductor substrates (semiconductor chips) when stacking the semiconductor substrates, and a manufacturing method of such a semiconductor device.

According to embodiment(s) of the present invention, a semiconductor device includes a semiconductor substrate that includes a first region, a second region having a thickness that is less than a thickness of the first region, a third region having a thickness that is intermediate of the thickness of the first region and the thickness of the second region. The semiconductor substrate also has a first surface and a second surface opposing the first surface, a first metal film having the same film thickness that is provided in each of a first through hole, and a second through hole and a third through hole, the first through hole penetrates the semiconductor substrate from the second surface to the first surface in the first region, the second through hole penetrates the semiconductor substrate from the second surface to the first surface in the second region, and the third through hole penetrates the semiconductor substrate from the second surface to the first surface in the third region. The semiconductor substrate also has a second metal film that is formed on the first metal films and is provided at least inside the first through hole, at least outside of the second through hole, and inside and outside of the third through hole. The semiconductor substrate also has a third metal film that is formed on the second metal film and is provided outside of the first, second and third through holes. A film thickness of the second metal film located outside of the third through hole is greater than a film thickness of the second metal film located outside the first through hole and is less than a film thickness of the second metal film located outside the second through hole, and heights of upper surfaces of the third metal film in the first, second and third regions are the same with respect to the first surface as a standard.

BRIEF DESCRIPTION OF THE DRAWINGS

FIG. 7 is a cross-sectional view of a semiconductor device of a comparative example.

FIGS. 8A and 8B are diagrams for explaining the manufacturing process of the semiconductor device of the comparative example.

DETAILED DESCRIPTION

Figure 1:
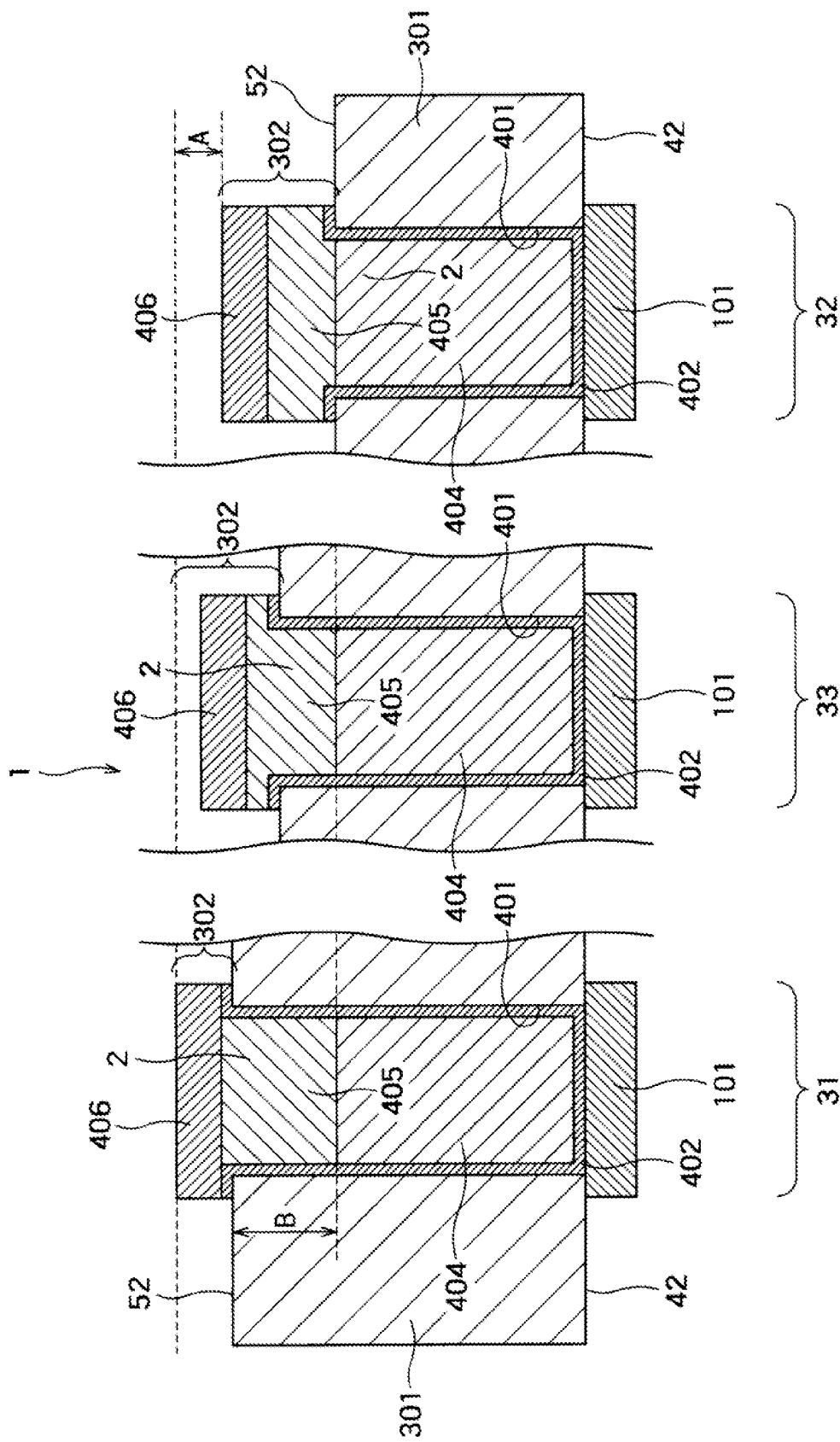
FIG. 1 is a cross-sectional view of a semiconductor device according to an embodiment.

Embodiments of the invention provide a semiconductor device that can improve reliability of device characteristics while avoiding connection failure between semiconductor substrates (semiconductor chips) when stacking the semiconductor substrates, and a manufacturing method of such a semiconductor device.

Embodiments are explained below with reference to the drawings. However, the present invention is not limited to the embodiments. In addition, common parts in the drawings are indicated with common symbols, and duplicative explanations are omitted for brevity. Moreover, the drawings are schematics for providing explanations of the invention and its understanding. Shapes, scales, ratios and the like may be different from the actual device. Designs may be appropriately modified based on the below explanations and known technologies.

However, in the below explanations, terms such as "the same," "substantially the same," "equal" and "substantially equal" used for height, surface shape and the like, are not intended to mean only the cases in which the objects are mathematically the same as or equal to each other. However, they also include meanings of differences or roughness at industrially acceptable levels in the manufacturing process of the semiconductor devices. Furthermore, expressions relating to the shape and height are not intended to indicate mathematically defined shapes and the like. Shapes and the like that include differences (errors and warping) at industrially acceptable levels in the manufacturing process of the semiconductor devices are also included as shapes and the like that correspond to the shape.

A semiconductor device 1 according to the present embodiment is explained by using FIG. 1. Here, a semiconductor device having through silicon vias (TSVs) 2 formed by using a backside via TSV process is explained as an example. More specifically, FIG. 1 is a cross-sectional view of the semiconductor device 1. In the cross-sectional view of the semiconductor device 1 shown in FIG. 1, an upper side is the back surface side (second surface) 52 of a semiconductor substrate 301, and a lower side is the front surface side (first surface) 42 of the semiconductor substrate 301.

In general, a thickness of the semiconductor substrate 301 fluctuates within the back surface 52 as a process, such as layer thinning, is performed on the back surface 52 side. Thus, in the cross-sectional view of the semiconductor device 1 shown in FIG. 1, a first region 31 is a region in which the thickness of the semiconductor substrate 301 is greatest, and a second region 32 is a region in which the thickness of the semiconductor substrate 301 is least. In addition, a third region 33 is an intermediate region in which the thickness of the semiconductor substrate 301 is between the thicknesses of the first region 31 and the second region 32.

As shown in FIG. 1, the semiconductor device 1 includes, throughout the first to third regions 31 to 33, respective TSVs 2 provided on the semiconductor substrate 301, back surface side electrode structures 302 provided on the respective TSVs 2 on the back surface 52, and front surface side electrodes 101 provided on the front surface 42 side of the semiconductor substrate 301 so as to contact the respective TSVs 2. Microelectronic elements and the like are provided on the semiconductor substrate 301 but illustration of the elements are omitted in FIG. 1.

In the example shown in FIG. 1, each of the TSVs 2 in the first to third regions 31 to 33 includes a TSV hole (through hole) 401 that penetrates the semiconductor substrate 301 from the back surface 52 to the front surface 42 thereof, an insulation film layer (not shown) and a barrier metal 402 that cover side surfaces and a bottom surface (a bottom surface located on the front surface 42 side) inside the TSV hole 401, and a metal film 404 (first metal film) embedded inside the TSV hole 401. Each of the TSVs 2 in the first and third regions 31 and 33 also includes a metal film 405 (second metal film) embedded inside the TSV hole 401.

In detail, the metal film 404 has the same film thickness in each region. The metal film 404 is embedded inside each TSV hole 401 to substantially the same height with respect to the front surface 42 as a standard (or when compared using the front surface 42 as a standard), so as to fill the TSV hole 401 from the front surface 42 side. The metal film 404 is formed so that the TSV hole 401 in the second region 32 is filled with the metal film 404 to correspond with the height of the back surface 52.

Then, the metal film 405 is formed on the metal film 404 and inside and/or overfilled to extend outside the TSV hole 401. In other words, the metal film 405 is provided inside the TSV hole 401 in the first region 31, outside the TSV hole 401 in the second region 32, and inside and outside the TSV hole 401 in the third region 33. In detail, the film thickness of the metal film 405 located outside the TSV hole 401 corresponds to the thickness of the semiconductor substrate 301 in the region where the metal film 405 is located. That is, the thinner the cross-sectional thickness of the semiconductor substrate 301 in the region in which the metal film is located, the thicker the film thickness of the metal film 405 located outside the TSV hole 401 becomes. The metal film 405 is formed so that the TSV hole 401 in the first region 31 is filled by the metal film 404 and the metal film 405 to the height of the back surface 52. Therefore, in the example shown in FIG. 1, the film thickness of the metal film 405 located outside the TSV hole 401 in the third region 33 is greater than the film thickness of the metal film 405 located outside the TSV hole 401 in the first region 31 and is less than the film thickness of the metal film 405 located outside the TSV hole 401 in the second region 32. In other words, the TSV 2 in the first region 31 includes the entire metal film 405 located inside the TSV hole 401. The TSV 2 in the third region 33 includes a part of the metal film 405 located inside the TSV hole 401. In contrast, the back surface side electrode structure 302 in the second region 32 includes the entire metal film 405 located outside the TSV hole 401, and the back surface side electrode structure 302 in the third region 33 includes a part of the metal film 405 that is overfilled outside of the TSV hole 401.

Moreover, a metal film (third metal film) 406 is formed on the metal film 405 and is provided outside of the TSV hole 401. This metal film 406 is configured as a part of or may comprise the entire back surface side electrode structure 302. The thickness of the metal film 406 is substantially equal in the first to third regions 31 to 33. In the example shown in FIG. 1, the back surface side electrode structure 302 in the first region 31 is configured from only the metal film 406, and the back surface side electrode structure 302 in the second region 32 and the third region 33 are configured from the metal film 405 and the metal film 406.

In other words, in the example of the semiconductor device 1 shown in FIG. 1, in the first region 31, the TSV 2 is configured from the TSV hole 401, the barrier metal 402, the metal film 404 and the metal film 405, and the back surface side electrode structure 302 located on the TSV 2 is configured from a single layer of the metal film 406. Moreover, in the second region 32, the TSV 2 is configured from the TSV hole 401, the barrier metal 402 and the metal film 404, and the back surface side electrode structure 302 is configured from two layers including the metal film 405 and the metal film 406. Further, in the third region 33, the TSV 2 is configured from the TSV hole 401, the barrier metal 402, the metal film 404 and the metal film 405, and the back surface side electrode structure 302 is configured from two layers including the metal film 405 and the metal film 406.

Figure 2:
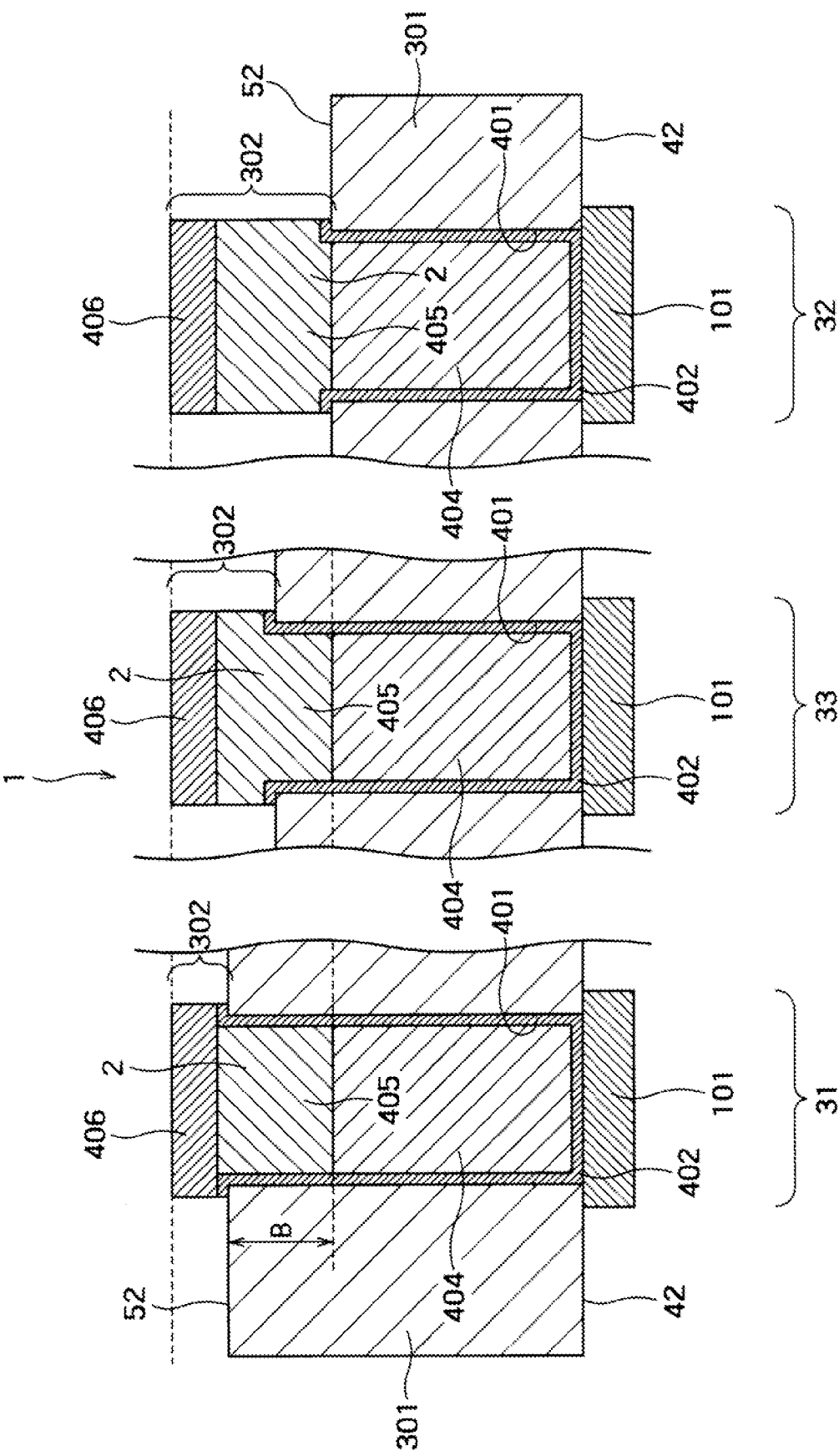
FIG. 2 is a cross-sectional view of a semiconductor device according to a modified example of the embodiment.

As discussed earlier, the film thickness of the metal film 405 located outside the TSV hole 401 corresponds to the thickness of the semiconductor substrate 301 in the region in which the metal film 405 is located. Therefore, in the semiconductor device 1 of the present embodiment, fluctuations in the height of the upper surface of the metal film 406 included in the back surface side electrode structure 302, as indicated by A in FIG. 1, is less than the fluctuation of the height of the back surface 52 of the semiconductor substrate 301, as indicated by B in FIG. 1, with respect to the front surface 42 of the semiconductor substrate 301 as a standard. As indicated by A in FIG. 1 (i.e., difference between the height of the upper surface of the metal film 406 in the first region 31 and the height of the upper surface of the metal film 406 in the second region 32) is smaller than the fluctuation of the height of the back surface 52 of the semiconductor substrate 301 with respect to the front surface 42 of the semiconductor substrate 301 as a standard, as indicated by B in FIG. 1 (i.e., difference between the thickness of the semiconductor substrate 301 in the first region 31 and the second region 32). As shown in the modified embodiment shown in FIG. 2, the height of the upper surfaces of the metal films 406 (back surface side electrode structure 302) in the first to third regions 31 to 33, with respect to the front surface 42 of the semiconductor substrate 301 as a standard, is substantially the same.

In addition, the TSV holes 401 are formed such that the shape and size of the plurality of TSV holes 401 formed inside the surface of the semiconductor substrate 301, as seen from the upper side of the back surface 52, are substantially the same. For example, the TSV holes 401 are formed circular, and their diameter is 10 μm or less.

Moreover, the back surface side electrode structures 302 are formed such that the shape and size of the plurality of back surface side electrode structure 302 formed inside the surface of the semiconductor substrate 301, as seen from the upper side of the back surface 52, are substantially the same. For example, the shape of each of the back surface side electrode structures 302 is circular. Further, the size (diameter) of the back surface side electrode structure 302 is greater than the diameter of the TSV hole 401 because the back surface side electrode structure 302 is formed to cover the entire TSV hole 401. However, the size of the back surface side electrode structure 302 is smaller than three times of the diameter of the TSV hole 401 to increase integration density on the surface of the semiconductor substrate 301. Then, as discussed in detail later, the height of the back surface side electrode structure 302 may be close to the depth of the TSV hole 401 as shown in the modification example shown in FIG. 2, to make the height of the upper surface of each back surface side electrode structure 302 (metal film 406), with respect to the front surface 42 of the semiconductor substrate 301 as a standard, substantially the same.

Furthermore, a metal film made of Ti, Ta and the like may be used as the barrier metal 402. A metal film made of Cu, Ni and the like may be used as the metal film 404. A metal film made of Cu, Ni, Sn, SnAg and the like may be used as the metal film 405. A metal film made of Cu, Ni, Sn, SnAg and the like, or a laminated film of these materials may be used as the metal film 406. Various combinations of the materials of the metal film 404, the metal film 405 and the metal film 406 may be possible. A combination of materials that minimizes degradation of device characteristics, and the like, due to dispersion of chemical species from film to film, while ensuring connectivity between the films in contact with each other. If the connectivity or minimizing the dispersion of chemical species is difficult, another metal film may be formed between the adjacent metal films. For example, where the metal film 405 is made of a Cu film and where the metal film 406 is made of an Sn film, an Ni film may be formed between the metal film 405 and the metal film 406 to avoid dispersion of Cu. Therefore, in the present embodiment, one or two layers of films are laminated inside the TSV hole 401 and one or two layers are laminated outside of the TSV hole 401 on the back surface side electrode structure 302. However, the present embodiment is not limited to this. The film laminated inside the TSV hole 401 and on the back surface side electrode structure 302 may be respectively configured from three or more layers.

Next, a manufacturing method of the semiconductor device 1 according to the present embodiment is explained with reference to FIGS. 3 to 6. In detail, FIGS. 3 to 6 are cross-sectional views to aid in the explanation of the respective steps of the manufacturing method of the semiconductor device 1, which corresponds to FIG. 1. Here, an example is explained in which the TSV 2 is formed using the backside via TSV process.

First, a semiconductor substrate 301, on which the front surface side electrodes 101 have already been formed and the back surface side 52 of which has been polished, and a thickness of the semiconductor substrate 301 is measured by an optical means. Then, the TSV holes 401 are formed so as to penetrate the semiconductor substrate 301 from the back surface 52 to the front surface 42. In addition, using a CVD method and a sputtering method, the insulation film layer (not shown) and the barrier metal 402 are formed to cover the side surfaces and the bottom surface (bottom surface located on the front surface 42 side) inside the TSV holes 401. The barrier metal 402 is formed to prevent the chemical species of Cu and the like from dispersing into the inside of the semiconductor substrate 301 from the Cu film, or the like, that is to be embedded in the TSV holes 401. The barrier metal 402 is formed not only inside the TSV holes 401 but also on the back surface 52 of the semiconductor substrate 301.

Next, using the sputtering method, a seed layer (not shown), configured from a Cu film, is formed inside the TSV holes 401 so that the seed layer is proximate the front surface side 42.

Figure 3:
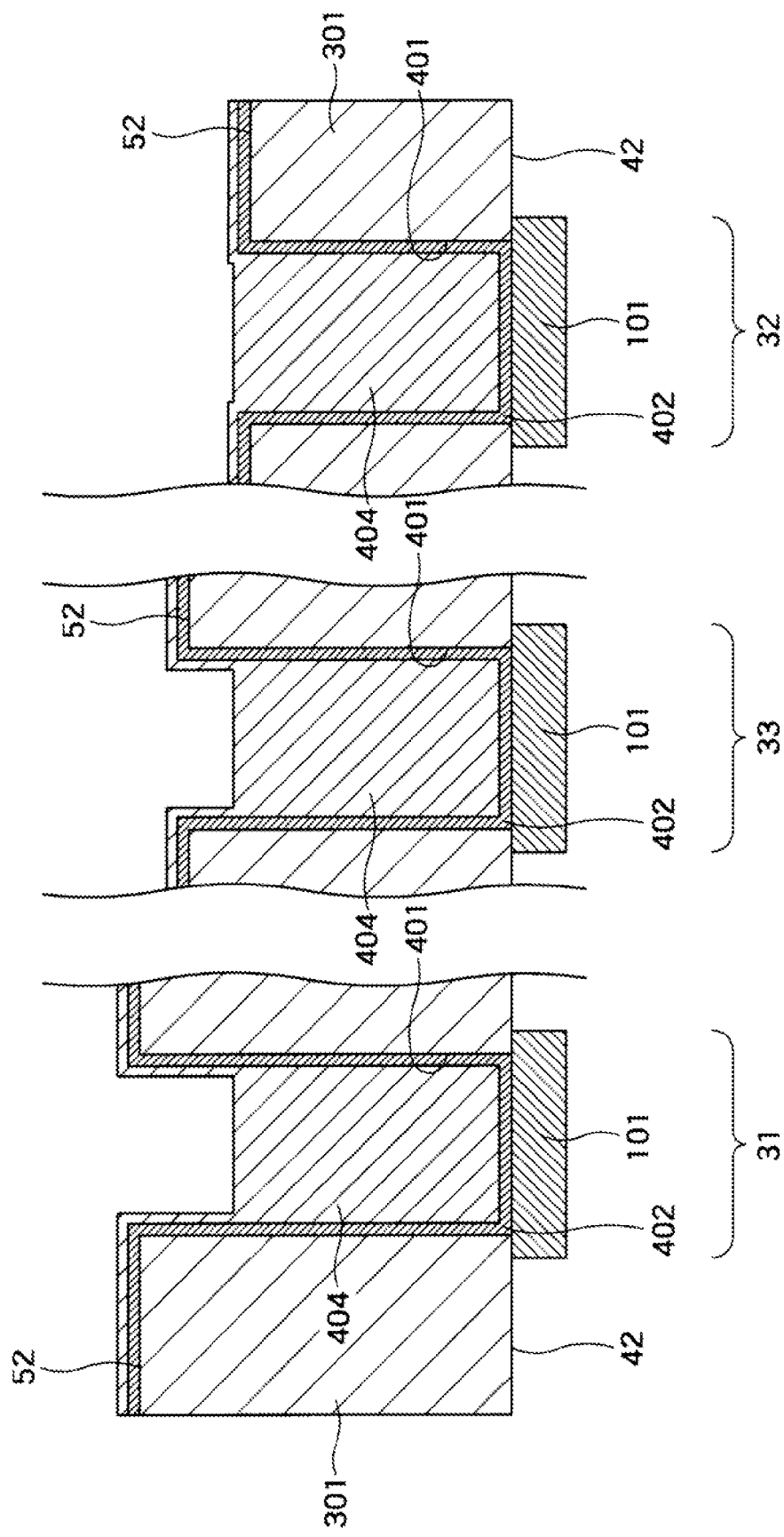
FIG. 3 is a diagram for explaining a manufacturing process of the semiconductor device according to the embodiment.

Further, using the seed layer, the metal film 404, configured from a Cu film, is deposited inside the TSV hole 401, for example, using the bottom-up-fill plating method. At this time, the metal film 404 is embedded inside each of the TSV holes 401 up to substantially the same height with respect to the front surface 42 as a standard so as to extend to the front surface 42 side. In addition, the metal film 404 is formed so that the TSV hole 401 in the second region 32 is filled by the metal film 404 to the height of the back surface 52. Moreover, a condition for forming the metal film 404 at this time, such as plating time and the like, is determined in advance based on the thickness information of the semiconductor substrate 301 measured previously. Therefore, as shown in FIG. 3, the heights of the metal films 404 embedded in the respective TSV holes 401 in the first to third regions 31 to 33, with respect to the front surface 42 as a standard, are substantially the same. Thus, each TSV hole 401 in the first region 31 and third region 33 is not filled to the height of the back surface 52. In other words, the metal film 404 is embedded to a depth near the middle of the TSV holes 401 in the first region 31 and the third region 33.

Figure 4:
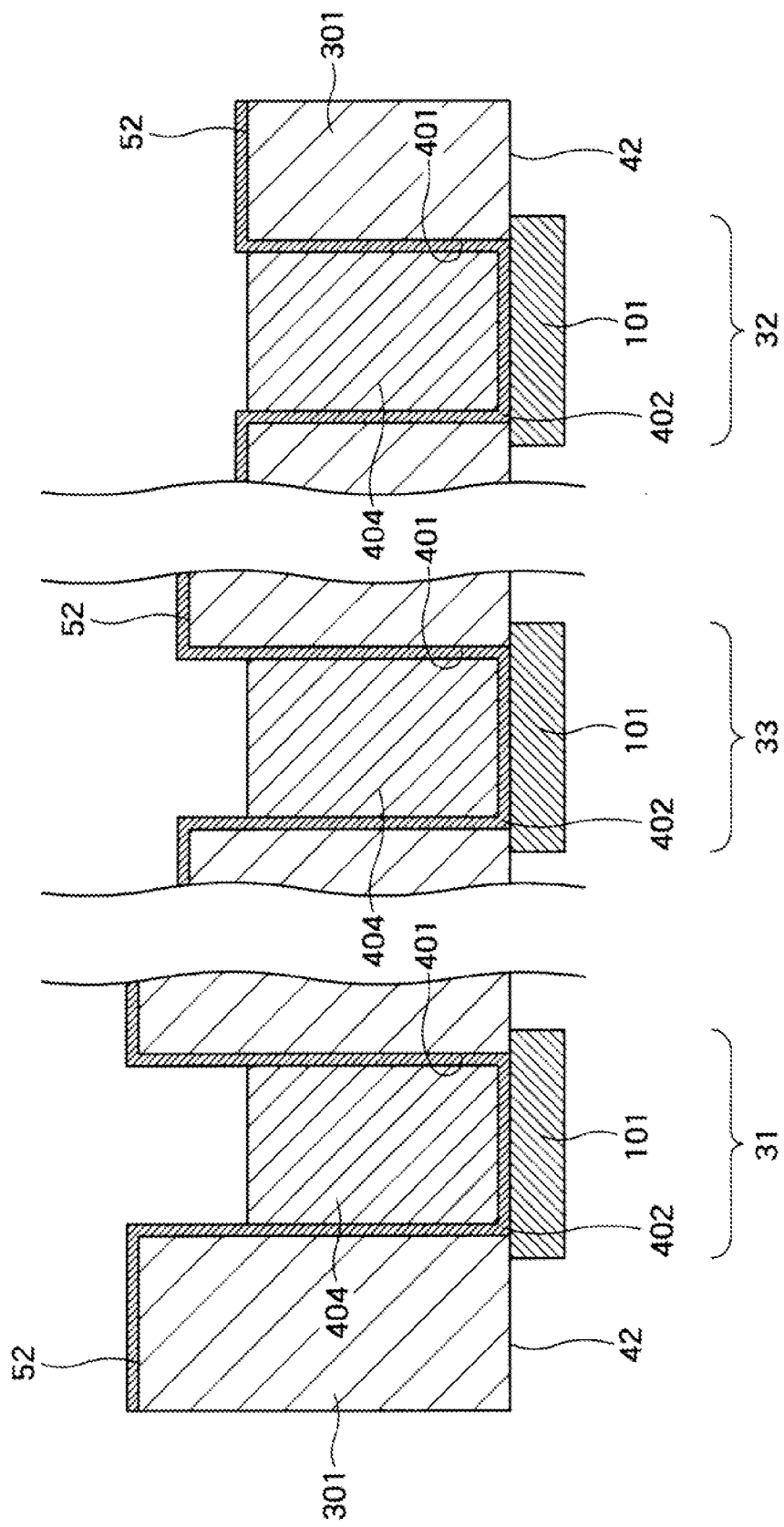
FIG. 4 is a diagram for explaining the manufacturing process of the semiconductor device according to the embodiment following FIG. 3.
Figure 5:
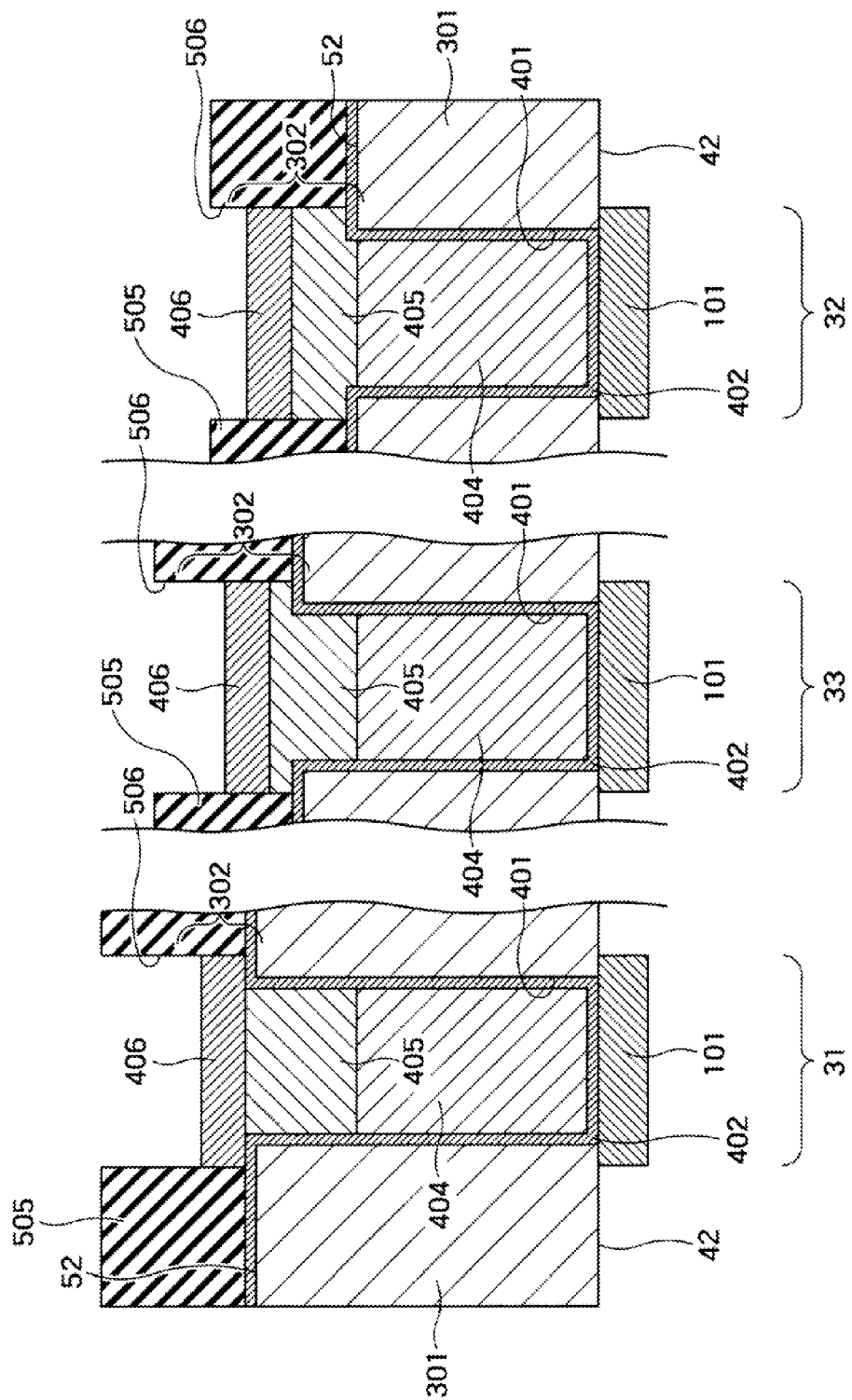
FIG. 5 is a diagram for explaining the manufacturing process of the semiconductor device according to the embodiment following FIG. 4.

As shown in FIG. 4, using the wet etching method or the like, the metal film 404 that has accumulated on the back surface 52 of the semiconductor substrate 301 and on the side surfaces of the TSV hole 401, and the metal film 404 that has been embedded in the TSV hole 401 is etched back. This etchback process may be omitted and is optional.

Moreover, a resist pattern (pattern mask) 505 for forming the back surface side electrode structure 302 is formed on the back surface 52 of the semiconductor substrate 301. This resist pattern 505 includes a plurality of opening parts 506 that are matched in shape, size and location of the back surface side electrode structure 302. Therefore, as viewed from above the back surface 52, each opening part 506 that the resist pattern 505 includes is located above each TSV hole

401. Then, as is clear from the above explanations, the size of the opening 506 that corresponds to the back surface side electrode structure 302 is greater than the cross section of the TSV hole 401 and smaller than three times of the diameter of the TSV hole 401 to increase the integration density on the semiconductor substrate 301. Further, the size of the opening part 506 is close to the size of the TSV hole 401.

Then, using the resist pattern 505 as a mask, the metal film 405 is formed on the metal film 404 embedded inside the TSV hole 401, by a lamination method, such as an electroless plating method, that allows a metal that configures the metal film 405 to be laminated with a uniform amount (volume) inside the surface of the semiconductor substrate 301. In detail, the metal film 405 is formed so that an area inside of the opening part 506 of the resist pattern 505 and outside the TSV hole 401, or the inside of the TSV hole 401, is filled from the lower side (bottom) by the metal film 405. The condition for forming the metal film 405, such as plating time and the like, at this time may be determined in advance based on the thickness information of the semiconductor substrate 301 measured previously. Moreover, the metal film 405 is formed so that the TSV hole 401 in the first region 31 is filled by the metal film 405 at least to the height of the back surface 52.

As discussed above, by using the resist pattern 505 having the above-described opening parts 506 as a mask and by forming the metal film 405 by the lamination method that allows the metal film 405 to be laminated with a uniform amount (volume) inside the surface of the semiconductor substrate 301, the metal is laminated at the same volume in any regions at the same lamination time. Therefore, the metal film 405 is formed so that a film thickness of each metal film 405 located outside the TSV hole 401 corresponds to the thickness of the semiconductor substrate 301 in the region in which the TSV hole 401 is located. That is, according to the present embodiment, the metal film 405 that is laminated with the uniform amount is formed so as to fill the TSV hole 401, or extend outside the TSV hole 401 and inside the opening part 506 when the TSV hole 401 has already been filled with the metal film 404, from the lower side of the TSV hole 401. Therefore, the thinner the thickness of the semiconductor substrate 301 in the region in which the TSV hole 401 is located is, the thicker the film thickness of the metal film 405 located outside the TSV hole 401 is formed to be. If the size of the opening part 506 is close to the size of the TSV hole 401, the film thickness of the metal film 405 formed inside the TSV hole 401 in the first region 31, the film thickness of the metal film 405 formed outside the TSV hole 401 in the second region 32, and the total film thickness of the metal film 405 formed inside and outside the TSV hole 401 in the third region 33 are made close to each other. That is, the heights of the upper surface of the metal film 405 in each region, with respect to the front surface 42 of the semiconductor substrate 301 as a standard, can be made substantially the same.

Thereafter, the metal film 406 is formed on the metal film 405 using the plating method, for example. In detail, the metal film 406 is formed so as to cover the outside of the TSV hole 401 and the inside of the opening part 506 of the resist pattern 505 by the metal film 406. If the metal film 405 is formed so as to fill the TSV hole 401 in the first region 31 with the metal film 405 to the height of the back surface 52, the film thickness of each metal film 406 can be made substantially equal because the metal film 406 is formed inside each opening part 506 located outside the TSV hole 401. Therefore, when the size of the opening part 506 is closer to the size of the TSV hole 401, the heights of the upper surface of each metal film 405, with respect to the front surface 42 of the semiconductor substrate 301 as a standard, can be made substantially the same. In addition, the height of the upper surface of each metal film 406 can be made substantially the same because the metal film 406 having substantially the same film thickness is formed on the metal film 405. By doing so, the structure shown in 5 is obtained.

Figure 6:
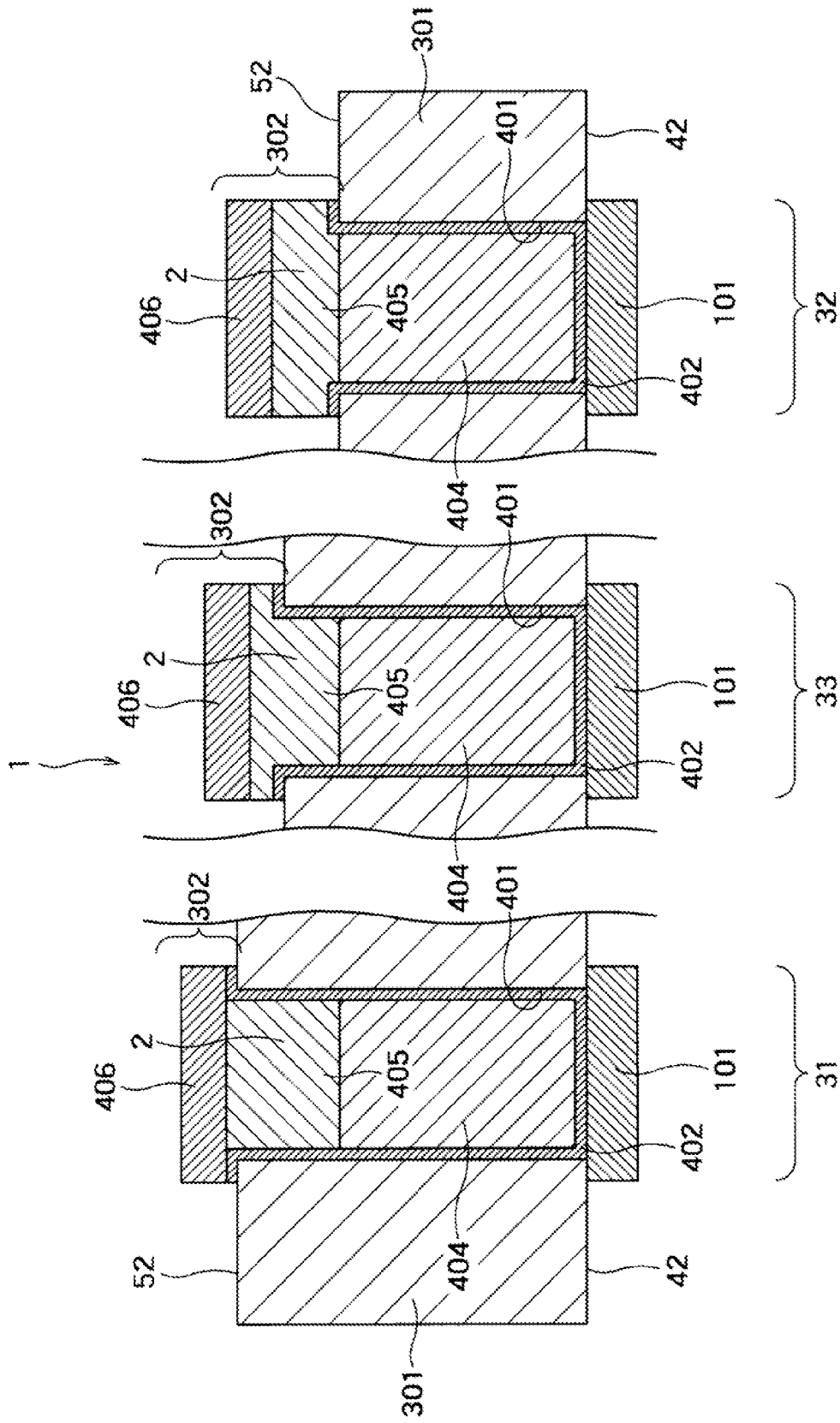
FIG. 6 is a diagram for explaining the manufacturing process of the semiconductor device according to the embodiment following FIG. 5.

Next, as shown in FIG. 6, using the wet etching method or the like, the resist pattern 505 and the barrier metal 402 located immediately below the resist pattern 505 are removed. By doing so, the semiconductor device 1 of the present embodiment is obtained.

According to the present embodiment, the metal film 405 can be formed so that the film thickness of the metal film 405 located outside the TSV hole 401 corresponds to the thickness of the semiconductor substrate 301 in the region in which the TSV hole 401 is located. Therefore, fluctuation of the height of the upper surface of the metal film 406 included in the back surface side electrode structure 302, with respect to the front surface 42 of the semiconductor substrate 301 as a standard, is reduced. As a result, connection failure between the semiconductor substrates when stacking a plurality of semiconductor substrates 301 can be avoided. Moreover, defects caused by cracks in the plurality of semiconductor substrates 301 can be avoided during stacking of the semiconductor substrates 301. For example, when the thicknesses of the plurality of semiconductor substrates 301 can are not uniform, local pressure must be applied to stack the semiconductor substrates 301. Therefore, occurrence of cracks inside the semiconductor substrate 301 due to the stress generated by local pressure is avoided, resulting in improved reliability of the device characteristics provided to the semiconductor substrate 301. Below explains the details.

As explained above, fluctuation of the thickness of the semiconductor substrate 301 generally occurs within the surface thereof due to the thinning of the semiconductor substrate 301 and the like. In the manufacturing method of the semiconductor device 1 that the inventor(s) had considered, the back surface side electrode structure 302 was formed in a state where such fluctuation of the thickness of the semiconductor substrate 301 was present inside the surface of the semiconductor substrate 301. As a comparative example, a semiconductor device 100 that is formed by the manufacturing method that the inventor previously considered is shown in FIG. 7. Also in the comparative example shown in FIG. 7, the first region 31 is the region in which the thickness of the semiconductor substrate 301 is greatest, and the second region 32 is the region in which the thickness of the semiconductor substrate 301 is least. Moreover, the third region 33 is an intermediate region in which the thickness of the semiconductor substrate 301 is between the thicknesses of the first region 31 and the second region 32. As clear from FIG. 7, in this comparative example, only the metal film 404 fills the TSV hole 401 in each TSV 2 in the first to third regions 31 to 33. Each back surface side electrode 302 is formed as a single layer configured from the metal film 406. Therefore, the fluctuation of the height of the upper surface of the back surface side electrode 302 based on the front surface 42 of the semiconductor substrate 301 (as indicated by C in FIG. 7) becomes substantially equal to the fluctuation of the height of the back surface 52 of the semiconductor substrate 301 in the first to third regions 31 to 33 (as indicated by D in FIG. 7).

Thereafter, the semiconductor substrate 301 in the comparative example is diced to form a plurality of semiconductor chips 606, and by stacking the plurality of semiconductor chips 606, a stacked module 607 is obtained. However, when the semiconductor chips 606 are stacked when there is fluctuation of the height of the upper surface of the back surface side electrodes 302 in the semiconductor substrate 301 of the comparative example, there are places where electric connection is easily secured between the electrodes of upper and lower semiconductor chips 606 and places where it is difficult to secure the electric connection due to gaps between the electrodes of the upper and lower semiconductor chips 606, as shown in FIG. 8A (see places indicated by a circle in FIG. 8A). That is, connection failure occurs in the stacked module 607. Moreover, in such a case, as shown in FIG. 8B, the semiconductor chips 606 are stacked with pressure (arrow shown FIG. 8B) applied in order to prevent such a connection failure from occurring, that is, to minimize the gaps between the upper and lower semiconductor chips 606. However, when the semiconductor chips 606 are stacked by applying the pressure, there may be a problem that cracks occur inside the semiconductor chip 606 at and/or near a location where the pressure is applied, or that characteristic properties of devices provided at the location change.

In contrast, in the present embodiment, the metal film 405 is formed between the metal film 404 and the metal film 406 and is formed so that the thickness of the metal film 405 located outside the TSV hole 401 corresponds to the thickness of the semiconductor substrate 301 in the region in which the TSV hole 401 is located. Therefore, fluctuations in the height of the upper surface of the back surface side electrode structure 302, with respect to the front surface 42 of the semiconductor substrate 301 as a standard, is reduced. With the reduced height fluctuation, gaps existing between electrodes of the upper and lower semiconductor chips 606 at the time of forming the stacked module are significantly minimized. Therefore, the electric connection between the electrodes of the semiconductor chips is easily established. In addition, large local pressure applied to the semiconductor chips during stacking is not necessary. As such, the cracks due to the pressure are prevented from occurring, and the device characteristics are not changed. In addition, the reliability of the device characteristics is improved.

In addition, conventionally, the stacked modules are formed by stacking semiconductor chips after obtaining the semiconductor chips by dicing a semiconductor substrate. However, by using the present embodiment that allows easy electrical connection, the stacked module can be easily formed by stacking semiconductor substrates as in the shape of the semiconductor substrate and dividing the stacked semiconductor substrate into desired size.

Moreover, in the manufacturing method of the semiconductor device 100 of the comparative example shown in FIG. 7, a plurality of the TSV holes 401 are formed on the semiconductor substrate 301, and insulation film layer (not shown) and the barrier metal 402 that cover the side surfaces and the bottom surface (bottom surface located on the front surface side 42 inside the TSV holes 401 are formed. Further, the metal film 404 is embedded in each TSV hole 401. After forming the TSV 2 as discussed above, an additional barrier metal 402 and a plating under layer (seed film (not shown)) made of Cu, for example, are formed on the metal film 404 embedded in the TSV hole 401. Additionally, the metal film 406 is formed by plating with the under layer as a seed, to form a back surface side electrode structure 302 that is configured from a single layer. That is, in the comparative example, the TSV 2 and the back surface side electrode 302 are separately formed. In the comparative example, the metal film 404 is formed so that the TSV hole 401 formed in the first region 31, which is a region where the thickness of the semiconductor substrate 301 is greatest, is filled with the metal film 404. Therefore, the metal film 404 may overflow from the TSV hole 401 in other regions. In that case, CMP must be performed to remove the metal film 404 that is overflowed from the TSV hole 401 after laminating the metal film 404. As a result of this CMP, the barrier metal 402 that is formed at the same time when the barrier metal formed on the back surface 52 of the semiconductor substrate 301 and around the TSV hole 401, which is formed at the same time as when the barrier metal 402 is formed inside the TSV hole 401, is removed together with the metal film 404, or is partially thinned during CMP. Thus, to prevent the chemical species from dispersing from the under layer made of Cu to the semiconductor substrate 301 in such a case, an additional barrier metal 402 is formed between the back surface 52 of the semiconductor substrate 301 and the metal film 404, and the back surface side electrode structure 302.

In contrast, in the present embodiment, the TSV 2 and a part of the back surface side electrode structure 302 are simultaneously formed depending on a depth of the TSV hole 401. Therefore, the barrier metal 402 formed on the back surface 52 of the semiconductor substrate 301 and around the TSV hole 401 is not removed with the metal film 404, nor is the barrier metal 402 thinned down. As a result, because the barrier metal 402 formed around the TSV hole 401 can be used as is, an additional barrier metal 402 need not be formed separately on the metal film 404. Normally, a Ti film, or the like, that has a high resistivity compared with a Cu film, is used for the barrier metal 402. In the present embodiment, because such a film with high resistivity is not formed between the metal film 404 and the back surface side electrode structure 302, the contact resistance between the TSV 2 and the back surface side electrode structure 302 is decreased. Moreover, in the comparative example, the increase of the contact resistance between the TSV 2 and the back surface side electrode structure 302 may possibly be avoided by selectively removing the barrier metal 402 on the metal film 404 by etching, or the like, after forming the barrier metal 404 on the metal film 404 and the entire back surface 52 of the semiconductor substrate 301. However, this may increase the of complexity of the manufacturing processes and increase manufacturing costs. Further, to use a film that contains Ni as a metal material that configures the back surface side electrode structure 302 to prevent the dispersion of chemical species to the semiconductor substrate 301 is a suitable alternative. Furthermore, an additional barrier metal 402 may be formed to prevent the dispersion of chemical species when a film that contains Cu as the metal material is used to form the back surface electrode structure 302.

The present invention is not limited to the use of the manufacturing process discussed in the above-described explanation of the manufacturing method of the semiconductor device of the present embodiment.

While certain embodiments have been described, these embodiments have been presented by way of example only and are not intended to limit the scope of the inventions. Indeed, the novel embodiments described herein may be embodied in a variety of other forms. Furthermore, various omissions, substitutions, changes and combinations in the form without departing from the spirit of the inventions. The accompanying claims and their equivalents are intended to cover such forms or modulations as would fall within the scope and spirits of the inventions.

What is claimed is:

1. A semiconductor device, comprising:
    a semiconductor substrate having a first surface opposing a second surface and including a first region, and a second region having a thickness that is less than a thickness of the first region;
    a first metal film that is provided in each of a first through hole and a second through hole formed between the first surface and the second surface of the semiconductor substrate within the first region and the second region, respectively;

a second metal film that is formed on the first metal film and is disposed inside the first through hole and outside of the second through hole;

a third metal film that is formed on the second metal film and is disposed outside of the first and second through holes, wherein:

a thickness of the second metal film located outside of the second through hole is greater than a thickness of the second metal film located outside of the first through hole, and a difference between a height of an upper surface of the third metal film in the first region and a height of an upper surface of the third metal film in the second region is less than the difference of a thickness of the semiconductor substrate at the first region and a thickness of the semiconductor substrate at the second region.

2. The semiconductor device according to claim 1, wherein the second through hole is filled with the first metal film to be coplanar with the second surface.

3. The semiconductor device according to claim 2, wherein the first through hole is filled with the first metal film and the second metal film to a plane adjacent a plane of the second surface.

4. The semiconductor device according to claim 3, wherein the semiconductor substrate further includes a third region having a thickness intermediate of the thickness of the first region and the thickness of the second region, the first metal film is provided in a third through hole formed between the first surface and the second surface of the semiconductor substrate in the third region and the first metal film has the same film thickness as the first metal film that is disposed in the first and second through holes, the second metal film is disposed inside and outside of the third through hole, the third metal film is disposed outside of the third through hole, and a thickness of the second metal film located outside of the third through hole is greater than a thickness of the second metal film located outside of the first through hole and is less than a thickness of the second metal film located outside of the second through hole.

5. The semiconductor device according to claim 1, wherein the first through hole is filled with the first metal film and the second metal film to a plane adjacent a plane of the second surface.

6. The semiconductor device according to claim 5, wherein the semiconductor substrate further includes a third region having a thickness intermediate of the thickness of the first region and the thickness of the second region, the first metal film is provided in a third through hole formed between the first surface and the second surface of the semiconductor substrate in the third region and the first metal film has the same film thickness as the first metal film that is disposed in the first and second through holes, the second metal film is disposed inside and outside of the third through hole, the third metal film is disposed outside of the third through hole, and a thickness of the second metal film located outside of the third through hole is greater than a thickness of the second metal film located outside of the first through hole and is less than a thickness of the second metal film located outside of the second through hole.

7. The semiconductor device according to claim 1, wherein the semiconductor substrate further includes a third region having a thickness intermediate of the thickness of the first region and the thickness of the second region, the first metal film is provided in a third through hole formed between the first surface and the second surface of the semiconductor substrate in the third region and the first metal film has the same film thickness as the first metal film that is disposed in the first and second through holes, the second metal film is disposed inside and outside of the third through hole, the third metal film is disposed outside of the third through hole, and a thickness of the second metal film located outside of the third through hole is greater than a thickness of the second metal film located outside of the first through hole and is less than a thickness of the second metal film located outside of the second through hole.

8. The semiconductor device according to claim 7, wherein the second through hole is filled with the first metal film to be coplanar with the second surface.

9. The semiconductor device according to claim 1, wherein the semiconductor substrate further includes a third region having a thickness intermediate of the thickness of the first region and the thickness of the second region, the first metal film is provided in a third through hole formed between the first surface and the second surface of the semiconductor substrate in the third region and the first metal film has the same film thickness as the first metal film that is disposed in the first and second through holes, the second metal film is disposed inside and outside of the third through hole, the third metal film is disposed outside of the third through hole, and a thickness of the second metal film located outside of the third through hole is greater than a thickness of the second metal film located outside of the first through hole and is less than a thickness of the second metal film located outside of the second through hole.

10. A semiconductor device, comprising:

a semiconductor substrate that:
  includes a first region having a first thickness, a second region having a second thickness that is less than the first thickness, and a third region having a thickness intermediate of the first thickness and the second thickness,
  has a first surface and a second surface opposing the first surface;

a first metal film having the same film thickness, the first metal film provided in each of a first through hole, and a second through hole and a third through hole formed in each of the first, the second, and the third regions, respectively, and formed through the semiconductor substrate from a first surface to a second surface thereof;

a second metal film that is formed on the first metal film and is disposed inside the first through hole, outside of the second through hole, and inside and outside of the third through hole;

a third metal film that is formed on the second metal film and is provided outside the first, second and third through holes, wherein:

a thickness of the second metal film located outside the third through hole is greater than a thickness of the second metal film located outside the first through hole and less than a thickness of the second metal film located outside the second through hole, and a height of an upper surface of the third metal film in the first, second and third regions are the same, as measured from the first surface.

11. The semiconductor device according to claim 10, wherein the second through hole is filled with the first metal film to be coplanar with the second surface.

12. The semiconductor device according to claim 11, wherein the first through hole is filled with the first metal film and the second metal film to a plane adjacent a plane of the second surface.

13. The semiconductor device according to claim 10, wherein the first through hole is filled with the first metal film and the second metal film to a plane adjacent a plane of the second surface.

* * * * *